US012134066B2

(12) United States Patent
Harvey et al.

(10) Patent No.: US 12,134,066 B2
(45) Date of Patent: Nov. 5, 2024

(54) COMBUSTION APPARATUS AND METHOD OF MAKING A COMBUSTION APPARATUS

(71) Applicant: University of Newcastle upon Tyne, Tyne and Wear (GB)

(72) Inventors: Adam Harvey, Tyne and Wear (GB); Kui Zhang, Tyne and Wear (GB)

(73) Assignee: University of Newcastle upon Tyne, Tyne and Wear (GB)

(*) Notice: Subject to any disclaimer, the term of this patent is extended or adjusted under 35 U.S.C. 154(b) by 0 days.

(21) Appl. No.: 16/768,977

(22) PCT Filed: Dec. 4, 2018

(86) PCT No.: PCT/GB2018/053515
§ 371 (c)(1),
(2) Date: Jun. 2, 2020

(87) PCT Pub. No.: WO2019/110983
PCT Pub. Date: Jun. 13, 2019

(65) Prior Publication Data
US 2020/0338492 A1    Oct. 29, 2020

(30) Foreign Application Priority Data
Dec. 4, 2017    (GB) ..................... 1720147

(51) Int. Cl.
*B01D 51/02*    (2006.01)
*B01D 49/00*    (2006.01)
(Continued)

(52) U.S. Cl.
CPC ............. *B01D 51/02* (2013.01); *B01D 49/00* (2013.01); *B01J 19/088* (2013.01);
(Continued)

(58) Field of Classification Search
CPC ........ B01D 51/02; B01D 49/00; B01D 53/70; B01D 53/92; B01D 53/56; B01D 53/60;
(Continued)

(56) References Cited

U.S. PATENT DOCUMENTS 5,980,610 A    11/1999   Huang et al.
6,029,442 A    2/2000    Caren et al.
(Continued)

FOREIGN PATENT DOCUMENTS

CA    2021692 A1    3/1991
CN    203508201 U   4/2014
(Continued)

OTHER PUBLICATIONS

JP-2004245091-A—English Google Translation (Year: 2003).*
(Continued)

*Primary Examiner* — Xiuyu Tai
(74) *Attorney, Agent, or Firm* — Morgan, Lewis & Bockius LLP

(57) ABSTRACT

This invention relates to a method of increasing the size of particulates in a gas comprising particulates, e.g. a gas that is formed from the combustion of fuels. The method comprises mixing an ionised gas stream with the gas comprising particulates.

9 Claims, 8 Drawing Sheets

(51) Int. Cl.
    *B01J 19/08*     (2006.01)
    *F01N 3/08*     (2006.01)
    *H01J 37/32*     (2006.01)
    *H05H 1/24*     (2006.01)
    *H05H 1/46*     (2006.01)
    *H05H 1/48*     (2006.01)

(52) U.S. Cl.
    CPC ............ *F01N 3/0892* (2013.01); *H01J 37/32* (2013.01); *B01J 2219/0809* (2013.01); *B01J 2219/0847* (2013.01); *B01J 2219/0849* (2013.01); *B01J 2219/0875* (2013.01); *B01J 2219/0896* (2013.01); *B01J 2219/1206* (2013.01); *H05H 1/461* (2021.05); *H05H 1/4645* (2021.05); *H05H 1/4697* (2021.05); *H05H 1/48* (2013.01); *H05H 2245/17* (2021.05)

(58) Field of Classification Search
    CPC ............ B01D 2259/818; F01N 3/0892; F01N 3/0871; F01N 2240/28; H05H 1/2406; H05H 1/4645; H05H 1/461; H05H 1/48; H05H 1/4697; H05H 2245/17; B01J 19/088; B01J 2219/0847; B01J 2219/0809; B01J 2219/0849; B01J 2219/0875; B01J 2219/0896; B01J 2219/1206; B01J 19/08; H01J 37/32; B03C 3/155; B03C 3/06; B03C 3/41; B03C 3/0175; B03C 3/49; B03C 2201/04; Y02T 10/12
    See application file for complete search history.

(56) References Cited

U.S. PATENT DOCUMENTS

| | | | | |
|---|---|---|---|---|
| 7,156,959 | B2 * | 1/2007 | Herbst | .................. B01J 19/088 422/186.04 |
| 9,643,125 | B2 | 5/2017 | Reddy et al. | |
| 2007/0071657 | A1 * | 3/2007 | Okubo | .................. B01D 53/70 422/186.05 |
| 2013/0192979 | A1 | 8/2013 | Xu et al. | |

FOREIGN PATENT DOCUMENTS

| | | | | |
|---|---|---|---|---|
| EP | 1329600 | A1 * | 7/2003 | ............. B01D 53/32 |
| EP | 1813351 | A1 | 1/2007 | |
| EP | 1837489 | A1 | 9/2007 | |
| GB | 2311025 | A | 9/1997 | |
| JP | 2004245091 | A * | 9/2004 | ............. B01D 49/00 |
| JP | 3702230 | B2 * | 10/2005 | ............. B01D 50/00 |
| WO | 2006101070 | A1 | 9/2006 | |
| WO | 2008016225 | A1 | 2/2008 | |
| WO | 2009080662 | A1 | 7/2009 | |
| WO | 2012097496 | A1 | 7/2012 | |

OTHER PUBLICATIONS

EP-1329600-A1—English Google Translation (Year: 2002).*
JP-3702230-B2—English Google Translation (Year: 2005).*
Chemical Engineering Research and Design, vol. 112, 2016, Yangxian Liu et al., "A review on removal of elemental mercury from flue gas using advanced oxidation process: Chemistry and process", pp. 199-250.
Journal of Hazardous Materials, vol. 185, No. 2-3, 2011, Bratislav M. Obradovic et al., "A dual-use of DBD plasma for simultaneous NOx and S02 removal from coal-combustion flue gas", pp. 1280-1286.
Search Report under Section 17(5), May 25, 2018, 4 pages.
International Search Report and Written Opinion mailed Feb. 19, 2019 for International Application PCT/GB2018/053515, 15 pages.
English Machine-Generated Translation of CN203508201U dated Jul. 26, 2017. (9 pages).
EPO Examination Report for European Patent Application No. 18819337.9, mailed on May 31, 2023 (7 Pages).

* cited by examiner

COMBUSTION APPARATUS AND METHOD OF MAKING A COMBUSTION APPARATUS

This application is the U.S. national stage application of International (PCT) Patent Application Serial No. PCT/GB2018/053515, filed Dec. 4, 2018, which claims the benefit of and priority to GB Application No. 1720147.6, filed Dec. 4, 2017. The entire disclosure of each of these applications is hereby incorporated by reference.

This invention relates to a method of increasing the size of particulates in an gas comprising particulates. The particulates may be formed by the result of combustion of fuels including biomass, Diesel, petroleum, coal etc.

BACKGROUND

The use of biomass as fuel is expected to increase with the recent trend towards minimising the use of fossil fuels. Combustion particulates formed from the burning of biomass fuels can be a significant health hazard as they contain harmful substances, such as polychlorinated dibenzo-p-dioxins and polychlorinated dibenzofuran (PCDD/F), polyaromatic hydrocarbons (PAH), and alkali salts such as potassium carbonate. Particulates from fossil fuels (such as coal) and diesel combustion are also known to be a significant health hazard.

The current biomass boiler particulate emission control technologies include: Electrostatic Precipitation (ESP), cyclones and Fabric Filter Systems. Fabric Filter Systems and ESP are costly and require high maintenance. They are difficult to retrofit. It is important to note that current particulate emission legislation is based on steady state tests, but smaller boilers are often started up and shut down, similar to automobiles, leading to greater emissions on average as rates of particulate emission are typically significantly higher on start-up and shutdown. Smaller biomass boilers can produce high emissions of particulate matter (PM) smaller than 2.5 microns ($PM_{2.5}$) and these are an important source of inhalable particulate matter in the ambient air. Small scale particulate emission cleanup is too expensive to be viable. It has been demonstrated that particulate emissions ($PM_{10}$, $PM_{2.5}$) can cause serious health problems (higher morbidity; infection of lungs; shorter life expectancy, etc.).

In some cities, airborne particulate matter (PM) concentrations now exceed sulfur dioxide and nitrogen oxides to become the principal urban pollutant. The effects of inhaling particulate matter that have been widely studied in humans and animals include asthma, lung cancer, respiratory diseases, cardiovascular disease, premature delivery, birth defects, low birth weight, and premature death. The World Health Organization (WHO) estimated in 2005 that "... fine particulate air pollution ($PM_{2.5}$), causes about 3% of mortality from cardiopulmonary disease, about 5% of mortality from cancer of the trachea, bronchus, and lung, and about 1% of mortality from acute respiratory infections in children under 5 years, worldwide". Short-term exposure at elevated concentrations can significantly contribute to heart disease, as recently described in a 2016 study. A 2011 study concluded that traffic exhaust is the single most serious preventable cause of heart attack in the general public, the cause of 7.4% of all attacks. Recent studies suggest that fine particles ($PM_{2.5}$) are the main cause of a number of health issues, at least in part because these particles are so small that they are able to penetrate the lungs.

Thus, there is a need for cost effective methods of reducing the amount of fine particulate matter ($PM_{2.5}$) produced by combustion processes. Such particulates are formed from various sources including biomass combustion, coal combustion, diesel & gasoline combustion, cement works, metal processing etc.

The present invention seeks to provide a means for reducing the amount of fine airborne particulates. The present invention can mitigate fine particulate emissions from biomass and other forms of combustion.

BRIEF SUMMARY OF THE DISCLOSURE

In a first aspect of the present invention there is provided a method of increasing the size of particulates in a gas comprising particulates (e.g. an exhaust gas formed in a combustion process), the method comprising:

directing a stream of gas towards a plasma source to generate an ionised gas stream; and directing the ionised gas stream towards a gas comprising particulates to convert a portion of the particulates into agglomerated particulates.

Directing the ionised gas stream towards the gas comprising particulates (e.g. exhaust gas) typically causes the ionised gas stream and the gas comprising particulates (e.g. exhaust gas) to mix.

The method of the present invention may further comprise the step of collecting the agglomerated particulates.

The stream of gas may be a stream of air. The air may be air from the environment, compressed air or air from another source. The stream of gas may comprise nitrogen, oxygen, carbon dioxide, argon or a mixture thereof.

Due to the abundance and low cost of air, it is envisaged that the gas will typically be air from the environment. Air typically includes about 78% nitrogen, 21% oxygen, 0.9% argon, 0.04% carbon dioxide, and small amounts of other gases, although the specific composition may vary depending on the location.

The air may be purified, scrubbed or filtered before being directed towards the plasma source.

In an embodiment, the gas may be nitrogen, oxygen, carbon dioxide, argon or a mixture thereof.

The ionised gas stream may comprise a mixture of charged and uncharged particles. The ionised gas stream will typically comprise anions and/or cations. It may also comprise free radicals and/or atoms/molecules in excited states. The amount of charged particles in the ionised gas stream will depend upon the plasma source. It may be that the ionised gas stream comprises from 0.001% to 100% charged molecules, with the remaining molecules uncharged. The ionised gas stream may comprise from 0.01% to 20%, from 0.1% to 10% or from 0.5% to 5% charged molecules.

The ionised gas stream will comprise an ionised gas. In an embodiment, the stream of charged particles will comprise ionised air. Thus, the ionised gas stream may contain ionised molecules of gases present in air, including at least one of ionised nitrogen, oxygen, carbon dioxide and argon.

The gas comprising particulates (e.g. the exhaust gas) may itself be flowing, e.g. through a flue, and may therefore be a gas stream comprising particulates (e.g. an exhaust gas stream). If the exhaust gas is flowing through a flue, it may be that this causes a suction effect that serves to draw the stream of gas into the plasma source and draw the ionised gas stream into the exhaust gas stream.

The method may be a method of reducing the amount of fine particulate matter ($PM_{2.5}$) in a gas comprising particulates (e.g. the exhaust gas or exhaust gas stream), in which case the particulates that are converted to agglomerated particulates are fine particulate matter. The gas comprising particulates (e.g. the exhaust gas or exhaust gas stream) is typically that formed in a combustion process. The method may be a method of reducing the amount of fine particulate matter ($PM_{2.5}$) in a gas comprising particulates (e.g. an exhaust gas formed in a combustion process), in which case the particulates that are converted to agglomerated particulates are fine particulate matter. Typically, exhaust gas formed in a combustion process will comprise particulates that will have been formed during the combustion of a fuel. The particulates will comprise particulates of varying sizes, including $PM_{2.5}$ (particulates with a diameter less than or equal to 2.5 microns) and $PM_{10}$ (particulates with a diameter less than or equal 10 microns).

$PM_{2.5}$ are known as fine particulates. The present method may reduce the proportion of fine particulate matter ($PM_{2.5}$) in the gas comprising particulates (e.g. the exhaust gas or exhaust gas stream).

Where the gas comprising particulates is an exhaust gas, the combustion that generated the exhaust gas will typically be the combustion of a fuel. Said fuel may be any combustible fuel. The fuel used for combustion may be a fuel selected from natural gas, petrol, diesel, jet fuel, oil, coal, biogas, wood or biomass. A particular fuel source in which the present invention provides an advantage is biomass fuels, which can produce a large amount of particulate matter. Common biomass fuels include wood, plants, bagasse, manure, peat and seeds.

Alternatively, the gas comprising particulates may be air from the home, a workplace (e.g. a factory or warehouse), inside a vehicle, etc. In a further alternative, the gas comprising particulate could be a gas emitted by a vacuum cleaner or other domestic appliance.

The method of the invention may increase the proportion of particulates that are larger than 2.5 microns in the gas comprising particulates (e.g. the exhaust gas or the exhaust gas stream). In an embodiment, the method of the invention will increase the amount of particulates that are larger than 2.5 microns in the gas comprising particulates (e.g. the exhaust gas or the exhaust gas stream) by greater than 10% of the total mass of particulates, greater than 15% of the total mass of particulates, or greater than 20% of the total mass of particulates.

The agglomeration of particulates will increase the average size of particulates in the gas comprising particulates (e.g. the exhaust gas or the exhaust gas stream). The gas comprising particulates (e.g. the exhaust gas or the exhaust gas stream) will typically see an increase in the average size of the particulates in the exhaust gas that is larger than 1 micron, larger than 2 microns or larger than 5 microns. Increasing the average size of particulates in an exhaust gas is advantageous because larger particulates are easier to collect than fine particulates. These particulates are large enough to be collected by a number of means known in the art, including filtration, electrostatic precipitation, cyclones and water scrubbing. These technologies are not typically capable of capturing all $PM_1$s (particulates below 1 μm in diameter), nor all PM2.5s.

The proportion of particulates greater than 2.5 microns in the gas comprising particulates (e.g. the exhaust gas or the exhaust gas stream) may increase by a factor of 2 or greater. The proportion of particulates greater than 2.5 microns in the gas comprising particulates (e.g. the exhaust gas or the exhaust gas stream) may increase by a factor of 4 or greater. The proportion of particulates greater than 2.5 microns in the gas comprising particulates (e.g. the exhaust gas or the exhaust gas stream) may increase by a factor of 6 or greater.

The proportion of the particulates in the gas comprising particulates (e.g. the exhaust gas or exhaust gas stream) that are fine particulates ($PM_{2.5}$) may be reduced to less than 90% of the original amount, to less than 80% of the original amount or to less than 50% of the original amount.

The proportion of the particulates in the gas comprising particulates (e.g. the exhaust gas or the exhaust gas stream) that are fine particulates ($PM_{2.5}$) may be reduced to less than 80%, less than 75%, less than 70%, less than 50% or to less than 25%.

Thus, the proportion of fine particulates ($PM_{2.5}$) in the gas comprising particulates (e.g. the exhaust gas or the exhaust gas stream) may be reduced by at least 10% or preferably by at least 20%, at least 25%, at least 30%, at least 50% or at least 75%.

The collection of agglomerated particulates sized greater than 2.5 microns may be performed by a number of methods known in the art, including filtration, electrostatic precipitation, cyclones and water scrubbing.

The exhaust gas (e.g. the exhaust gas stream) will typically be present within an exhaust flue connected to a combustion chamber. The collection step may be performed within the exhaust flue. Alternatively, the collection step may be performed just after the exhaust gas has exited the exhaust flue but before the exhaust gas is emitted to the environment.

The combustion chamber may be any device in which a fuel is burned, for example an engine, stove, boiler or heater. Typically, such devices have an exhaust flue which expels the waste products of the combustion.

Plasma

The plasma source may be an AC glow discharge, microwave plasma, gliding arc plasma, radio frequency plasma, DC corona torch, DC corona discharge reactor, or a dielectric barrier discharge (DBD) reactor.

The plasma source may be a dielectric barrier discharge plasma reactor.

The plasma source may comprise two electrodes, a cathode and an anode. Alternatively, the plasma source may comprise more than two electrodes. Where there are more than two electrodes, it may be that there is a single anode and a plurality of cathodes, it may be that there is a single cathode and a plurality of anodes or it may be that there are a plurality of cathodes and a plurality of anodes.

The plasma source is preferably a non-thermal plasma source. The use of non-thermal plasma means that there is no requirement for high temperatures to generate the plasma.

The plasma generated by the plasma source is preferably a low energy plasma. The plasma may, however, be a high energy plasma. The plasma generated by the plasma source is preferably a low energy non-thermal plasma.

The plasma source will ionise the components of air to form charged particles. These charged particles pass through the plasma chamber into the exhaust flue and transfer their charge onto the particulates present within the exhaust flue.

In the present invention, the exposure of air to the plasma will typically not result in the formation of hazardous substances such as ozone. Thus, the plasma source will not generally be high enough in energy to break covalent bonds in gas particles.

The methods of the present invention are preferably carried out using non-thermal plasmas. They may thus be carried out at temperatures less than 1000 K, e.g. temperatures less than 500 K. The method of the invention may also be carried out at ambient temperatures, e.g. from 0° C. to 200° C., 15° C. to 150° C. or from 15 to 75° C. It may be preferable to perform the method of the invention above 100° C. to avoid condensation of water vapour in the plasma chamber.

The methods of the invention may be carried out at atmospheric pressure. However, it will be appreciated that the methods of the invention can also be performed at both higher and lower pressures if required.

The plasma chamber, which comprises the plasma source, although not necessarily pre-heated, may see an increase in temperature. This may be as a result of its proximity to the combustion reaction and/or the exhaust flue.

The area in which the plasma is formed may be described as an ionisation zone. This typically is situated between the electrodes of a plasma generator and/or slightly downstream of the electrodes.

The current supplied to generate the plasma will be in the form of either alternating current or direct current. Thus, the current supplied to generate the plasma may be direct current. Preferably, however, alternating current is used. Use of alternating current generally allows greater control of the plasma and thus the outcome of the process. Furthermore, a smaller power source can be used with an AC power supply.

Typically, the dielectric barrier discharge reactor operates at a voltage of from 100 V to 3000 V.

The amount of current delivered to the plasma source will typically be in the range 0.1 to 200 mA.

The frequency of the current delivered to the plasma reactor may be from 5 kHz to 25 kHz.

The plasma source may be configured to operate from the moment the combustion reaction starts i.e. when the engine, boiler, heater or the like has been switched on. It has been found that particulate emissions are highest at start-up and shut-down of various combustion devices. Thus, it is important to have the plasma device working from the start of the combustion process until the end. The inventors have found that the methods of the invention are most effective during start-up and shutdown, when it is most needed. The inventors have also found that the methods of the invention are also effective during the de-ashing phase of a boiler (the period when the boiler empties the ash drawer), another phase in which there is a spike in particulate emissions.

In a second aspect of the present invention there is provided a combustion apparatus comprising:

a combustion chamber with an exhaust flue; and a plasma chamber for ionising gas and having an ionised gas outlet that is coupled to the exhaust flue so as to allow mixing of the ionised gas with an exhaust gas from the combustion chamber.

The ionised gas and the exhaust gas will mix in a portion of the exhaust flue that is downstream from the combustion chamber. Thus, the ionised gas outlet will typically be coupled with the exhaust flue via an inlet in the exhaust flue that is downstream from the combustion chamber. The portion of the exhaust flue in which the mixing will occur is typically in the region of this inlet and downstream from this inlet.

In an embodiment, the apparatus further comprises a particulate collection means, such as a cyclone, an electrostatic precipitator, a water scrubber or a filter. The particulate collection means will typically be situated downstream from the portion of the exhaust flue in which the ionised gas is mixed with the exhaust gas.

The ionised gas outlet may be connected to tubing, piping or any other vessel commonly used to transport gases to couple the plasma chamber to the exhaust flue.

The plasma chamber will typically comprise a plasma source. The plasma chamber may comprise multiple plasma sources.

The plasma source may be an AC glow discharge, microwave plasma, gliding arc plasma, radio frequency plasma, DC corona torch, DC corona discharge reactor, or a dielectric barrier discharge (DBD) reactor.

The plasma source may be a dielectric barrier discharge plasma reactor.

The plasma source may comprise two electrodes, a cathode and an anode. Alternatively, the plasma source may comprise more than two electrodes. Where there are more than two electrodes, it may be that there is a single anode and a plurality of cathodes, it may be that there is a single cathode and a plurality of anodes or it may be that there are a plurality of cathodes and a plurality of anodes.

The plasma source is preferably a non-thermal plasma source.

The ionisation of gases will typically take place within the plasma chamber. The plasma chamber will typically be arranged such that a gas can flow through it. This will allow uncharged gas to enter and become ionised through exposure to the plasma source, and it will allow the ionised gas to exit out of the plasma chamber in the direction of the exhaust flue.

The plasma chamber may be coupled to the exhaust flue by piping or tubing. Such a set up is demonstrated within FIG. 1. In this set up the gas source is air from the environment.

The plasma chamber may be coupled directly to the inlet in the exhaust flue.

It is preferable that the particulate matter from the exhaust flue is not exposed to the plasma itself. Thus, in some embodiments, the apparatus comprises a means to prevent gas from the exhaust flue from entering the plasma chamber. Thus, the plasma chamber may comprise a valve or filter to prevent combustion particulates passing into the plasma chamber and becoming directly exposed to the plasma source. Alternatively, or in addition, the exhaust flue may comprise a valve or filter to prevent combustion particulates passing into the plasma chamber.

Due to the heat generated by the combustion reaction and the flow of heated combustion products through the exhaust flue, air will typically be drawn into the exhaust flue via the plasma chamber. Thus, an air inlet having a valve or filter will not always be required.

In a third aspect of the invention there is provided a method of making a combustion apparatus, the method comprising:

providing a combustion chamber connected to an exhaust flue;

providing a plasma chamber for ionising gas, said plasma chamber having an ionised gas outlet;

coupling the ionised gas outlet to the exhaust flue such that ionised gas from the plasma chamber can be mixed with exhaust gas from the combustion chamber in the exhaust flue.

The step of forming an opening in the exhaust flue may comprise forming an inlet in the exhaust flue. The ionised gas outlet may be coupled to the inlet in the exhaust flue.

The ionised gas outlet may be coupled to the exhaust flue by a number of means known in the art, for example with piping or tubing.

The ionised gas outlet may be coupled directly to an inlet in the exhaust flue.

The method may further comprise adding a valve or filter to the plasma chamber to prevent combustion particulates passing into the plasma chamber. Alternatively, or in addition, the method may further comprise adding a valve or filter to the opening in the exhaust flue to prevent combustion particulates passing into the plasma chamber.

The plasma chamber may comprise a plasma source. The plasma source may be any of the plasma sources described herein. Preferably, the plasma chamber comprises a dielectric barrier discharge (DBD) reactor or a corona plasma reactor. The plasma source is preferably a non-thermal plasma source.

The combustion chamber may burn a fuel selected from natural gas, petrol, diesel, jet fuel, oil, coal, biogas, wood or biomass.

The combustion chamber may be an engine, stove, boiler or heater. The combustion chamber may be a biomass boilers or stoves.

The method of the first aspect may be carried out on a combustion apparatus of the second aspect of the invention. The combustion apparatus of the second aspect of the invention can be made according to the method of the third aspect of the invention. Any one or more of the embodiments described above for the first aspect of the invention can be applied, where appropriate, to the second and third aspects of the invention; any one or more of the embodiments described above for the second aspect of the invention can be applied, where appropriate, to the first and third aspects of the invention; and any one or more of the embodiments described above for the third aspect of the invention can be applied, where appropriate, to the first and second aspects of the invention.

The invention may also be as described in the following numbered paragraphs:

1. A method of increasing the size of particulates gas stream, the method comprising:
   directing a stream of gas towards a plasma source to generate an ionized gas stream; and
   directing the ionized gas stream towards an exhaust gas comprising particulates to convert a portion of the particulates into agglomerated particulates.
2. The method of paragraph 1, wherein the method further comprises collecting the agglomerated particulates.
3. The paragraph of paragraph 1 or paragraph 2, wherein the stream of gas is a stream of air.
4. The method of any preceding paragraph, wherein the exhaust gas is an exhaust gas stream.
5. The method of paragraph 4, wherein the exhaust gas is formed in the combustion of natural gas, petrol, diesel, oil, coal, biogas, wood or biomass fuel.
6. The paragraph of any preceding paragraph, wherein the plasma source is an AC glow discharge, microwave plasma, gliding arc plasma, radio frequency plasma, DC corona torch, DC corona discharge reactor, or a dielectric barrier discharge (DBD) reactor.
7. The method of paragraph 6, wherein the plasma source is a dielectric barrier discharge (DBD) reactor.
8. The method of any preceding paragraph, wherein the plasma source is a non-thermal plasma source.
9. The method of any preceding paragraph, wherein the proportion of fine particulates ($PM_{2.5}$) in the exhaust flue gas stream may reduce by at least 10% or preferably at least 20%.
10. A combustion apparatus comprising:
    a combustion chamber with an exhaust flue; and
    a plasma chamber for ionizing gas, said plasma chamber having an ionized gas outlet that is coupled to the exhaust flue for mixing ionized gas with exhaust gas from the combustion chamber such that ionised gas can be mixed with exhaust gas from the combustion chamber.
11. The combustion apparatus of paragraph 10, further comprising a particulate collection means.
12. The combustion apparatus of paragraph 10 or 11, wherein the plasma chamber comprises a plasma source selected from an AC glow discharge, a microwave plasma, gliding arc plasma, a radio frequency plasma, a DC corona torch, a DC corona discharge reactor, or a dielectric barrier discharge (DBD) reactor.
13. The combustion apparatus of any one of paragraphs 10 to 12, wherein the apparatus comprises a means to prevent gas from the exhaust flue entering the plasma chamber.
14. A method of making a combustion apparatus, the method comprising:
    providing a combustion chamber with an exhaust flue;
    providing a plasma chamber for ionizing gas, said plasma chamber having an ionized gas outlet;
    coupling the ionized gas outlet to exhaust flue such that ionized gas from the plasma chamber can be mixed with exhaust gas from the combustion chamber in the exhaust flue.

BRIEF DESCRIPTION OF THE DRAWINGS

Embodiments of the invention are further described hereinafter with reference to the accompanying drawings, in which.

DETAILED DESCRIPTION

Figure 1:
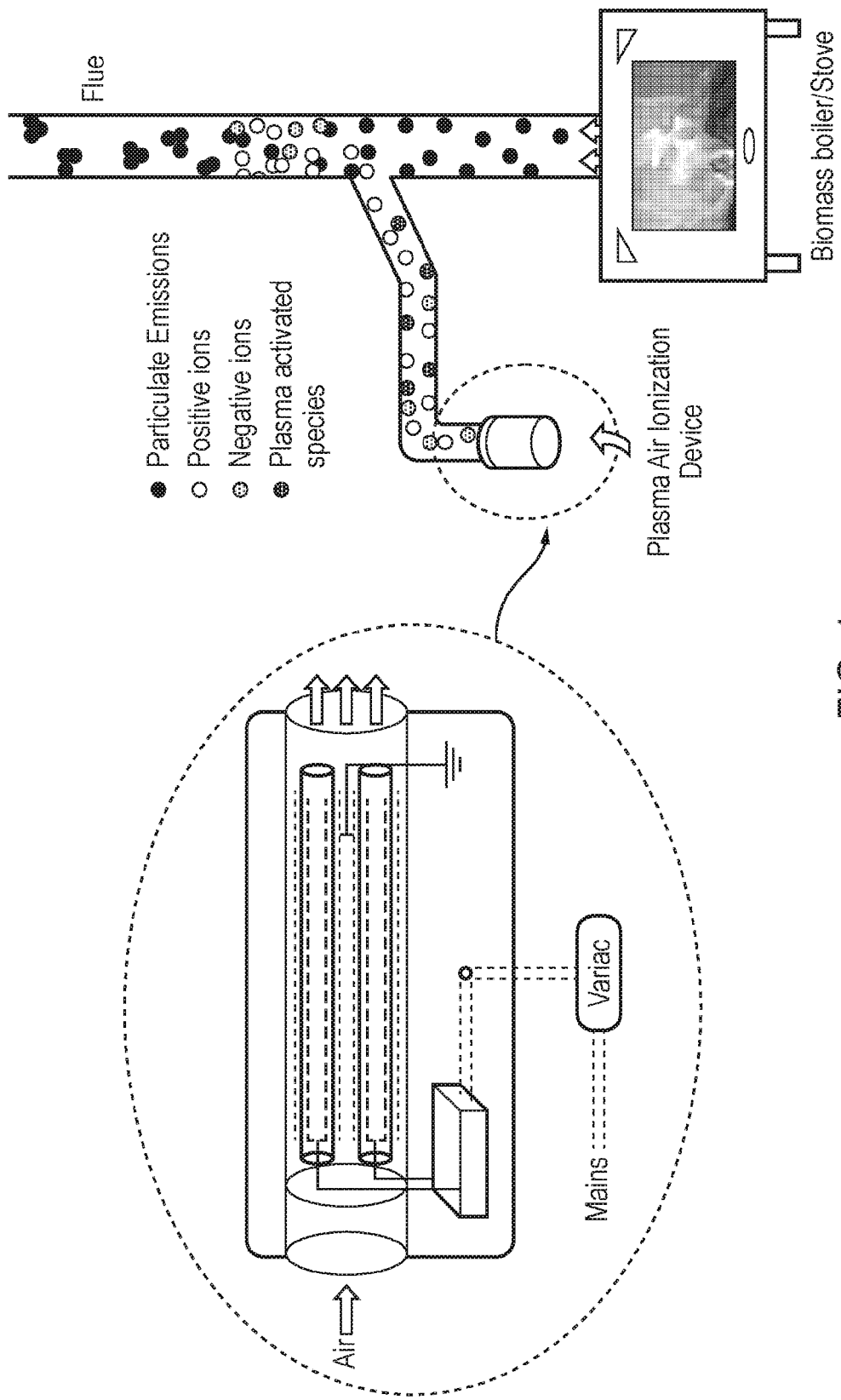
FIG. 1: Schematic of the integration of a plasma source chamber coupled to the exhaust flue of a biomass boiler.

Without wishing to be bound by theory, it is believed that the invention works as follows: An uncharged gas enters the plasma chamber and is exposed to the plasma source within the plasma chamber. The plasma source causes the gas molecules to become charged through ionisation. The charged gas molecules pass from the plasma chamber to the exhaust flue, typically through an air inlet located downstream from the combustion chamber. Within the exhaust flue, the charged gas contact fine particulate matter and cause these fine particulates to become charged. The charged fine particulates become attracted to other charged fine particulates, causing them to agglomerate and form larger particulates. These larger particulates are easier to remove from the exhaust gas than fine particulates and a number of methods of achieving this will be familiar to those skilled in the art.

A further advantage of decreasing the number of fine combustion particulates is that these particulates are small enough to be able to penetrate the lungs. Thus, even without a collection step it is beneficial to reduce the amount of fine particulates in an exhaust flue gas stream.

The plasma source should not come into direct contact with the products and particulates formed during combustion of the fuel. This avoids the deposition of particles onto the plasma source and the need to repeatedly clean and possibly replace the plasma source.

A benefit of the present invention is that a plasma chamber can be coupled to existing combustion devices to reduce their fine particulate emissions. Since the plasma chamber does not need to be installed into the combustion chamber or directly into the exhaust flue, there is no requirement to make significant and costly modifications to existing equipment. Exhaust flues on existing equipment can be retrofitted to couple the plasma chamber to the exhaust flue relatively simply, e.g. by cutting a small inlet into the exhaust flue. As such, there is no requirement to replace current combustion systems. Only a relatively minor and cost effective modification of the exhaust flue is required to accommodate the plasma device.

The incorporation of a plasma chamber to an exhaust flue allows existing equipment to be modified to reduce the amount of fine particulates emitted from the exhaust flue when the combustion chamber is running.

The present invention is expected to find potential uses in numerous devices which burn fuels, for example boilers and stoves, particularly biomass boilers and stoves. It may also find application in vehicle engines, especially diesel and biodiesel engines, domestic boilers, industrial boilers, central gas cleaning systems, cleaning dusty working environments and oil mist removal.

Throughout this specification, the terms "fine particulate matter" and "fine particulates" are intended to refer to $PM_{2.5}$ particulates which are formed during combustion. $PM_{2.5}$ have a diameter of 2.5 microns or less. These fine particles consist of carbon, trace metals (such as copper and zinc) and organic compounds. Evidence suggests that it is $PM_{2.5}$ particulates are the main cause of the harmful effects of particulate matter.

The ionisation of a gas or air may be performed using a single plasma source, or multiple plasma sources, depending upon the scale of the combustion process which is taking place. For example, in a domestic wood burner, a single plasma source may be sufficient, but in a power station, an array of plasma sources may be used.

Compared to current combustion particulate emission control technologies, the integration of a plasma chamber with existing combustion devices for particulate emission mitigation has several advantages. These advantages include low costs (low capital cost, low installation cost, low running cost and low maintenance cost), low maintenance, consistent efficiency, quick and easy installation and the option to retrofit the systems of the invention to existing equipment. The present invention offers a simple and affordable alternative to other technologies or can be combined with existing technologies to make those technologies more effective.

The term "air" is intended to encompass natural, unfiltered air from the environment but also encompasses air which may have been scrubbed or filtered before entering the air inlet. Preferably, the stream of air will not comprise a significant amount of particulate matter when it is exposed to the plasma source.

The term "exhaust flue" is intended to encompass a duct for smoke and waste gases produced by a fire, a gas heater, biomass boiler, a power station, vehicle engine or other fuel-burning installation. Thus, by way of non-limiting example, an exhaust flue in the context of the present invention may be a flue of a boiler or stove, a vehicle exhaust, the chimney of a power station boiler, etc.

The term "low-energy plasma" is intended to mean that at least 50% (e.g. at least 80%) of the electrons in the plasma have an energy lower than 5.5 eV. The term "high-energy plasma" is intended to mean that more than 50% of the electrons in the plasma have an energy greater than 5.5 eV. The energy distribution of the electrons can be calculated from the Maxwellian electron energy distribution function (EEDF).

The use of a non-thermal plasma in a plasma chamber means that there is no requirement to incorporate equipment which can withstand high temperatures into existing exhaust flues. A plasma chamber may be added to existing equipment by coupling to an exhaust flue, without the need for costly modification. FIG. 1 shows a schematic of the integration of a plasma chamber with an existing biomass boiler for particulate emission mitigation.

As mentioned above, the collection of agglomerated particulates sized greater than 2.5 microns may be performed by a number of methods known in the art, including filtration, electrostatic precipitation, cyclones and water scrubbing. Cyclones separate particulate matter from the gas stream by increasing the rotational effects and gravitational forces on the particles in the stream e.g. by increasing the tangential inertia. Electrostatic precipitators operate by imparting a charge onto the particles in a gas stream as they pass through an electric field. The charged particles are attracted to collector electrodes. Both dry electrostatic precipitators and wet electrostatic precipitators can be used. Fabric filters can be used to filter particles. Fabric filters can comprise polypropylene (PP), polyester (PE), polyacrylonitrile (PAN), polyimide (PI), polytetrafluoroethylene (PTFE), polyphenylenesulfide (PPS), PPS on PTFE fabric, fibre glass and aramides. Ceramic filters can be utilised. These can operate at higher temperatures than fabric filters. Wet scrubbers operate by inertial impaction, interception or diffusion. Inertial impaction is suitable for particles greater than 3 μm; diffusion is suitable for small particles. Inertial impaction can comprise wetted surface dedusters, where particles are collected on a surface before irrigation with a scrubbing liquid; or distributed liquid dedusters wherein the particles are collected by impaction directly with the scrubbing liquid.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

EXAMPLE 1

FIG. 1 shows a first exemplary apparatus 100 comprising a biomass boiler 102 (which is a type of combustion chamber) with an exhaust flue 104, and a plasma chamber 106 with an ionised gas outlet 108. In use, the biomass boiler 102 produces combustion products 110 that are a mixture of combustion gases and particulates, and the combustion products are drawn out of the boiler, into the exhaust flue 104. In use, air is drawn into the plasma chamber 106 through an air inlet, ionised gas 112 is produced within the plasma chamber, and the ionised gas flows out of the plasma chamber into the ionised gas exhaust flue 108. The ionised gas outlet 108 is coupled to the exhaust flue 104, where the ionised gas 112 is mixed into the combustion products 110, and the mixture continues along the exhaust flue and away from the biomass boiler 102.

The plasma chamber comprises a quartz tube and two stainless steel mesh electrodes. One electrode is positioned on the internal surface of the quartz tube, and the other electrode on the external surface of the quartz tube. The two electrodes are connected to a plasma power source unit that can supply 0-25 W to the ioniser by adjusting the amplitude of the applied voltage. The plasma can be generated on the two surfaces of the quartz tube. The outlet of the ioniser is coupled to the exhaust flue of the biomass boiler. The ionised air is sucked into the exhaust flue through the plasma ioniser.

Biomass boiler: ETA PU15 biomass boiler.
Fuel of the biomass boiler: VERDO wood pellets
Biomass boiler operation: (1) combustion from start to full load; (2) steady combustion state.

Figure 2:
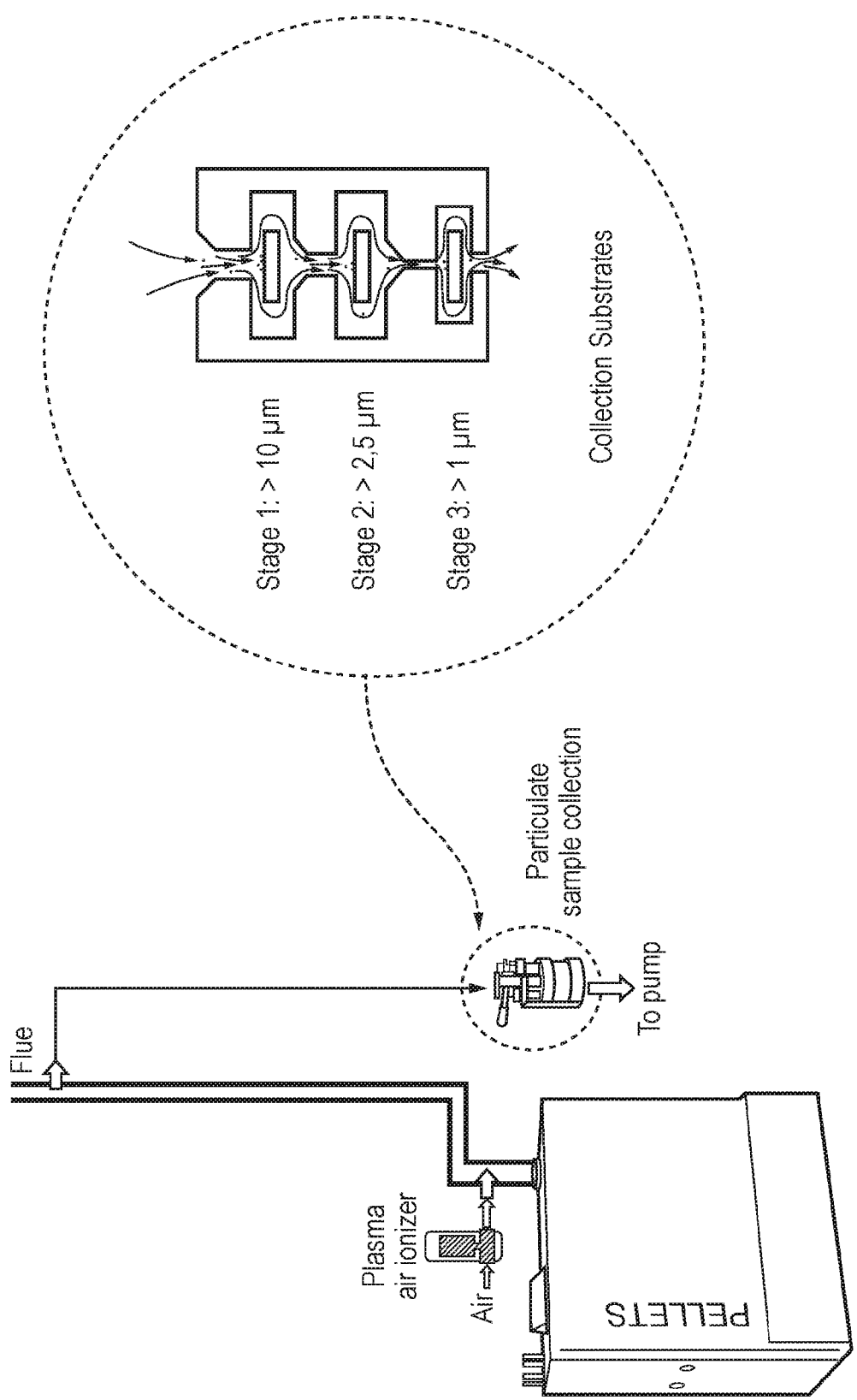
FIG. 2: Schematic of the particulate sample collection from a biomass boiler fitted with the plasma source.
Figure 3A:
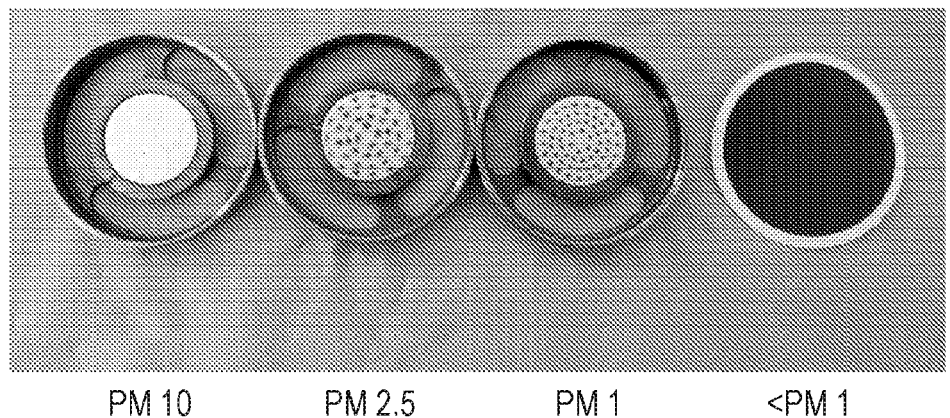
FIGS. 3A-3D: Effect of exposure of particulate matter from a biomass boiler to charged air particles on the combustion particulate emission (from start to full load) (from start to full load: the use of the plasma source reduced the total particulate emission by 45% (from 7.6 to 4.2 $mg/m^3$))
Figure 3B:
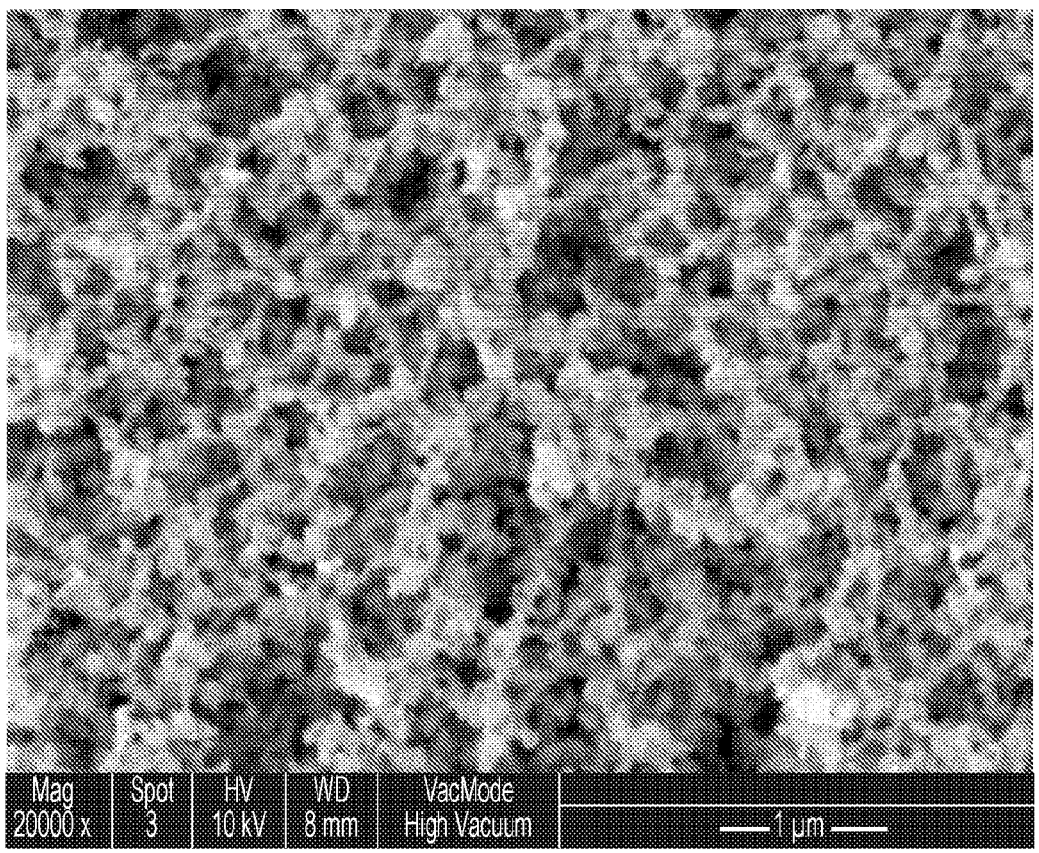
Figure 3C:
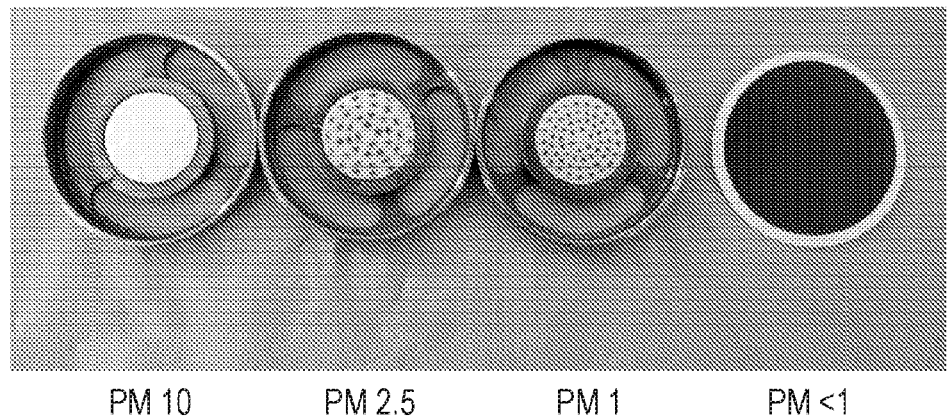
Figure 3D:
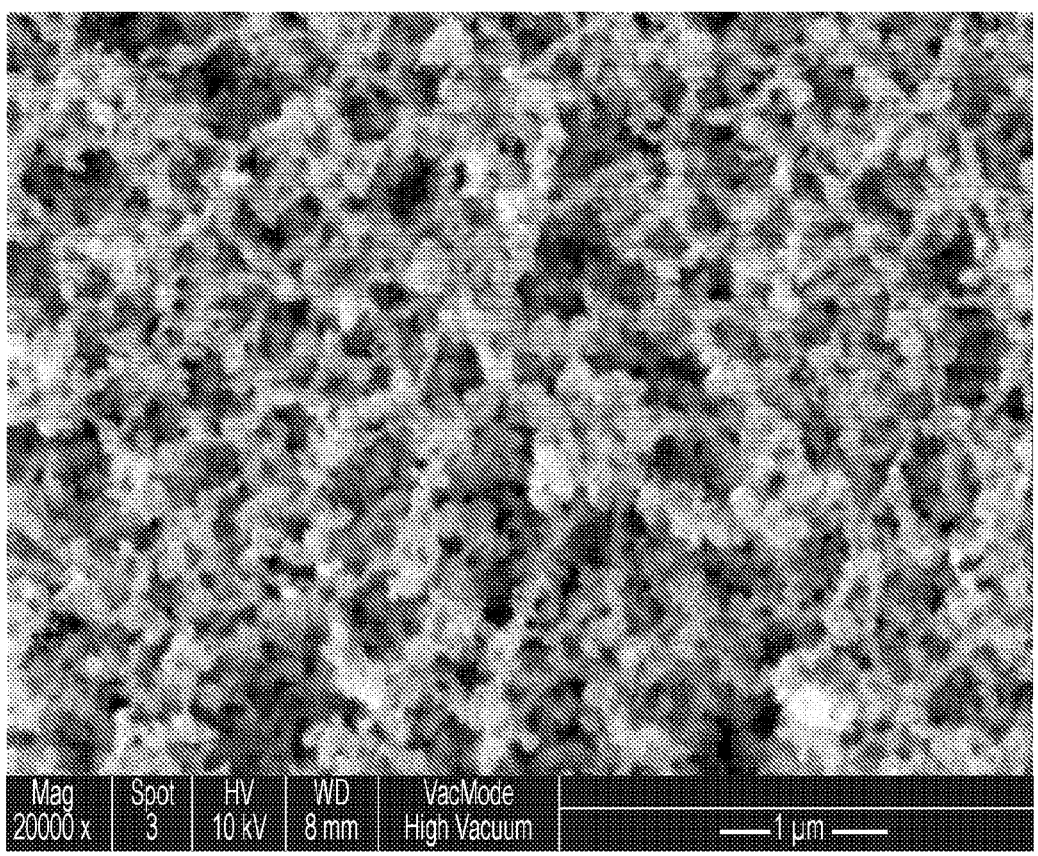
Figure 4A:
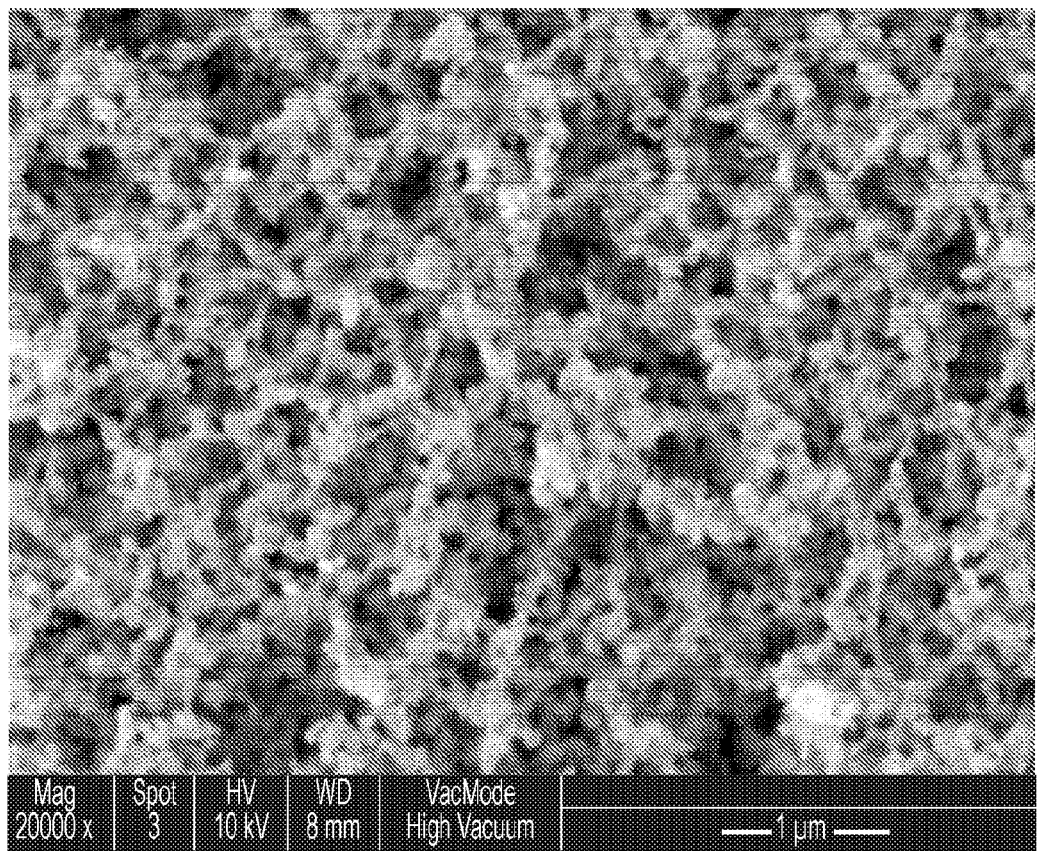
FIGS. 4A-4D: Effect of the use of a plasma source on particulate size distribution (PM<1) from start to full load.
Figure 4B:
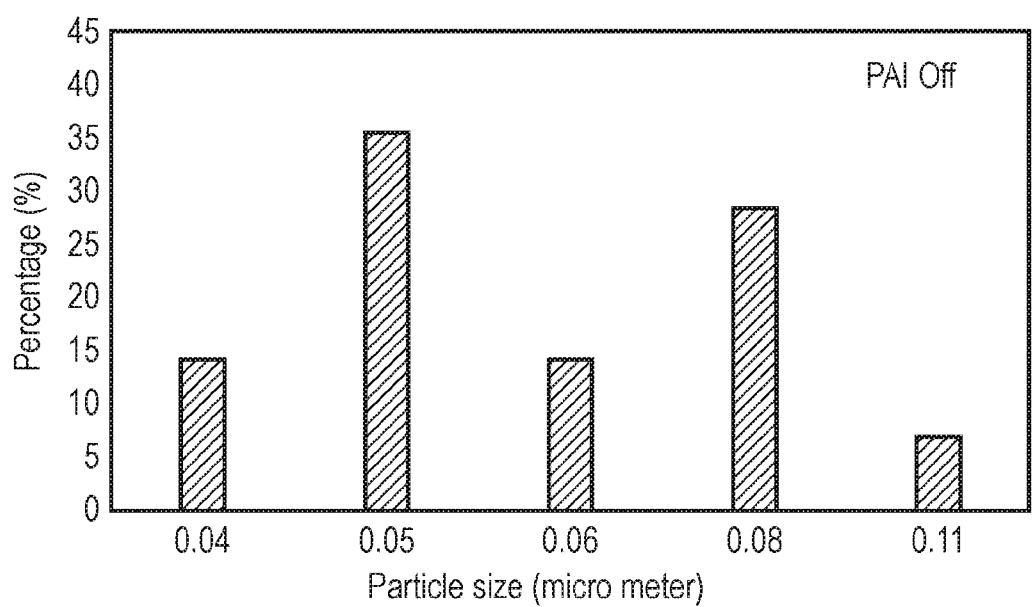
Figure 4C:
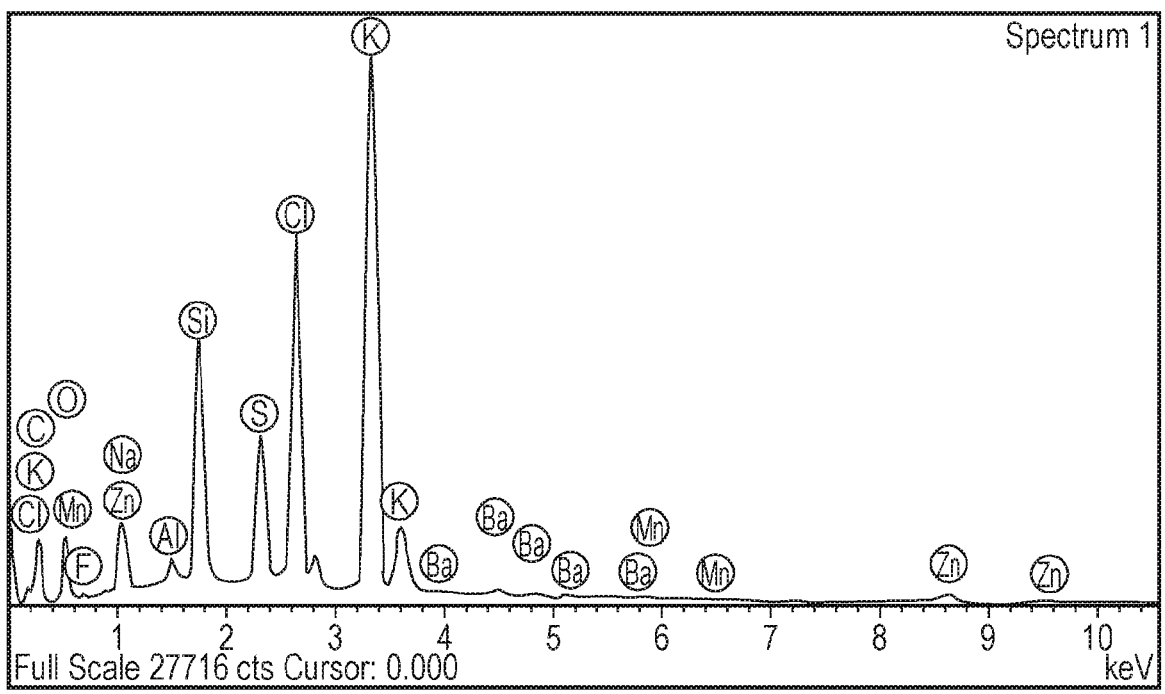
Figure 4D:
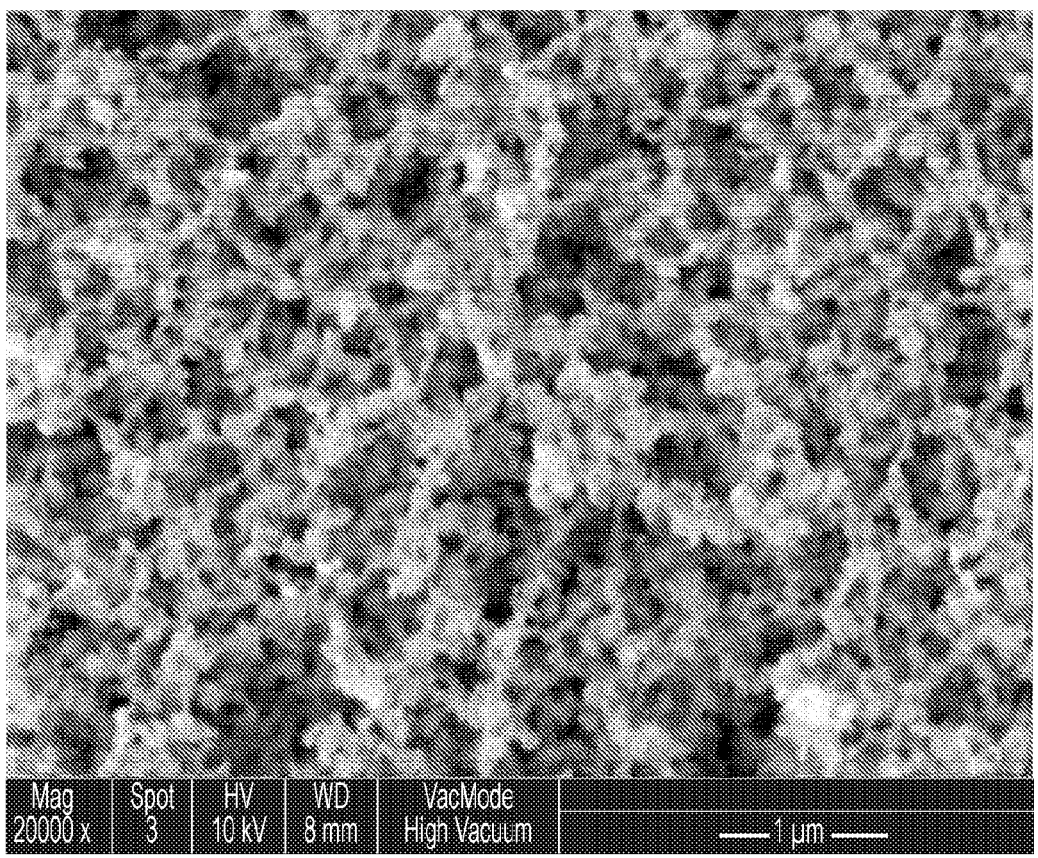
Figure 4E:
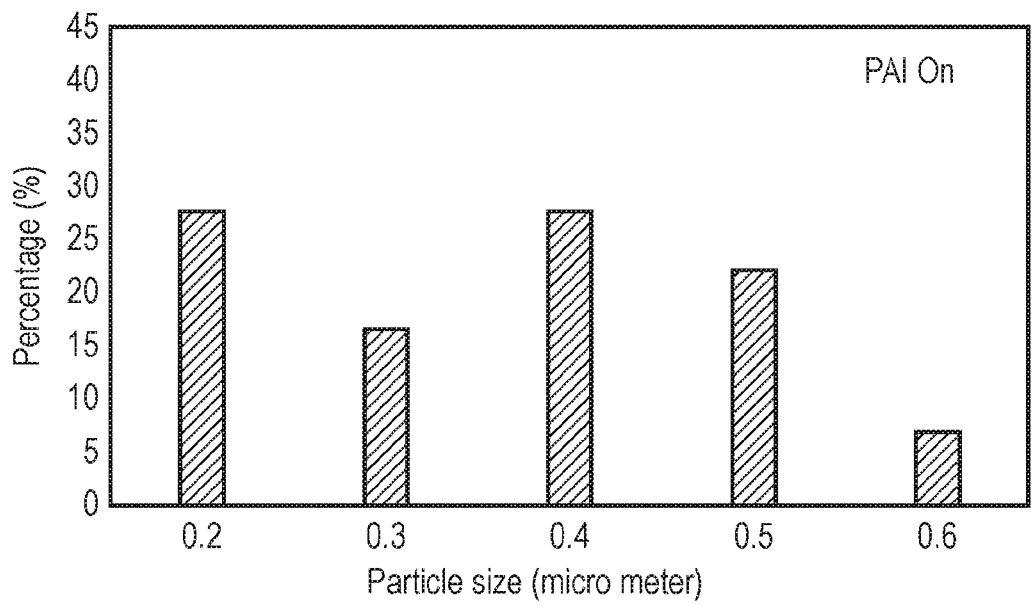
Figure 4F:
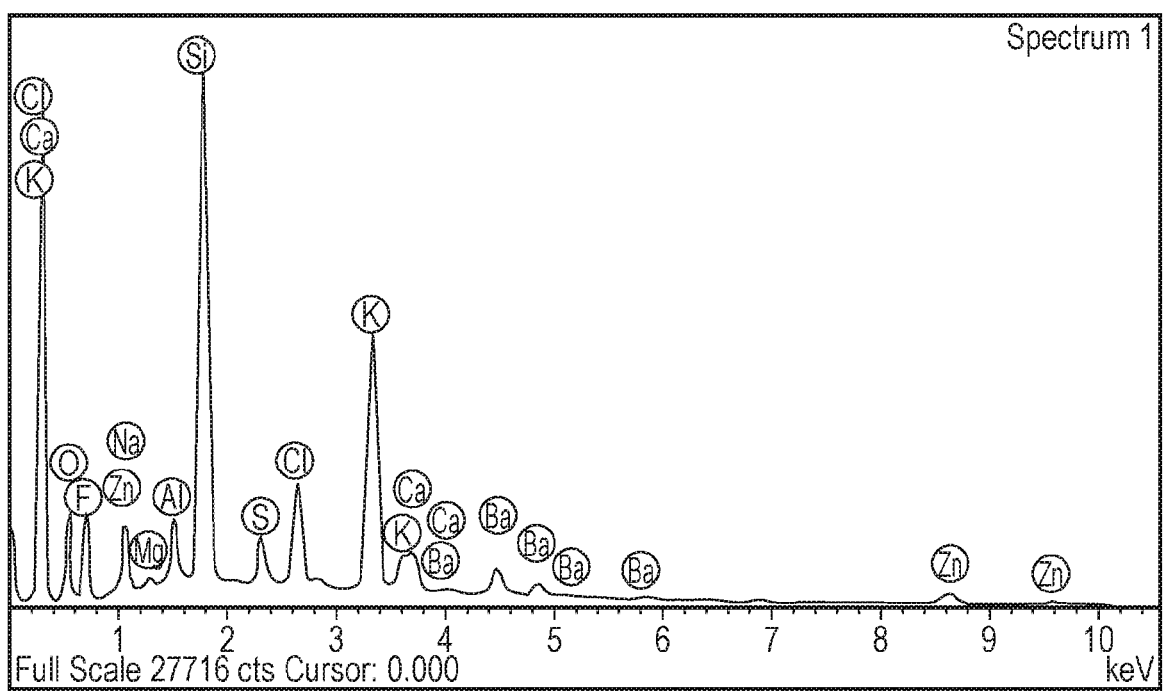
Figure 4G:
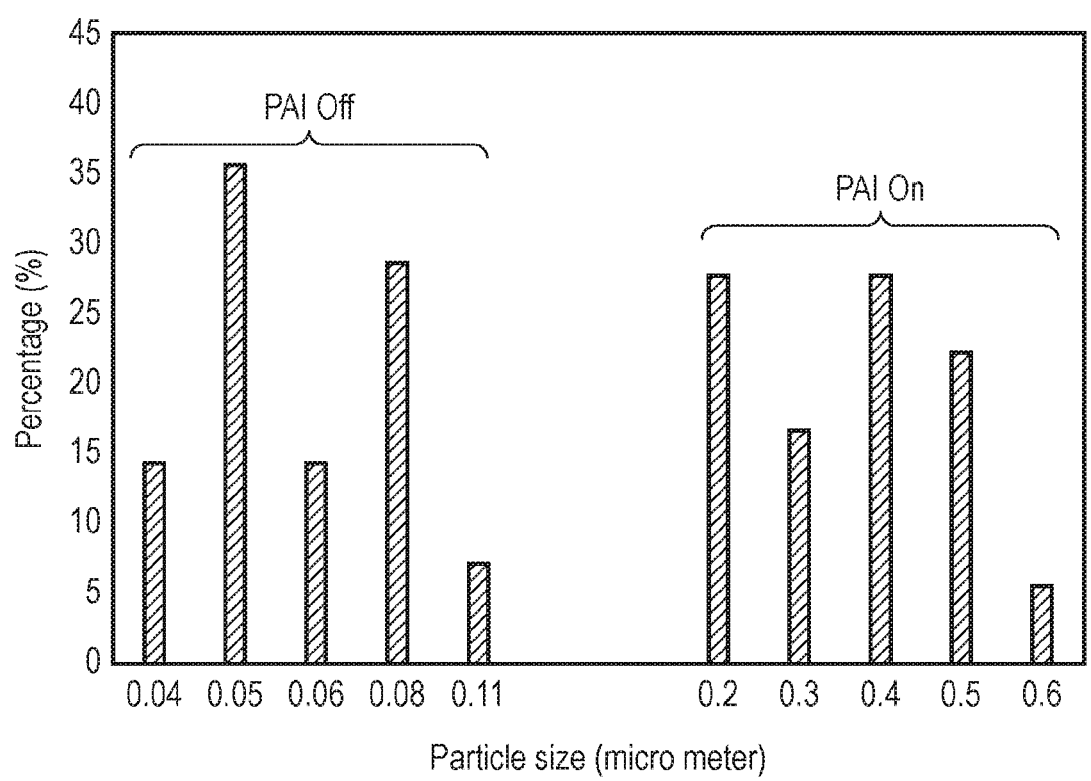

FIG. 2 shows a schematic of the experimental setup for biomass boiler combustion particulate emission control. Particles of diameter greater than 10 μm, those in the range 2.5-10 μm, those in the range 1-2.5 μm and particulates smaller than 1 μ) samples were collected by a Dekati® PM10 impactor. The Dekati® PM10 impactor has stage cut points of 10, 2.5 and 1.0 microns.

Before the measurement, a collection substrate is placed on each of the impactor stages and this substrate is weighed before and after the measurement to determine particle size distribution. Depending on the used substrate material, a chemical composition of the collected particles may also be determined after the sample collection. In the Dekati® PM10 impactor particles >1.0 microns are collected on 25 mm substrates and particles <1.0 microns are collected on a 47 mm filter.

In the experiment, the temperature of the impactor was kept at 125° C. to avoid water condensation; a pump was connected to the impactor to extract the gas samples at the flow rate of 30 L/min from the exhaust flue of the biomass boiler. The sampling time for each measurement was 30 minutes.

SEM and EDX measurement: A scanning electron microscopy (SEM, JSM-5300LV, Japan) incorporated with energy disperse X-ray (EDX) spectroscopy was used to investigate the morphology and the microstructure of the particulate collected from the exhaust flue of the biomass boiler.

The effect of the use of the plasma chamber of the present invention fitted to an exhaust flue of a biomass boiler combustion particulate emission (from startup of the boiler to full load) are provided. In addition to reducing the overall amount of particulate matter released from the exhaust flue, incorporation of a plasma chamber can increase the amount of larger particulates compared to smaller particulates. The collected particulate and SEM images of the collected particulate are shown in FIG. 3. The addition of ionised air into an exhaust flue using a plasma source increased the number of particles of diameter greater than 10 μm by a factor of 5.3 (from 1.5 to 7.9% by weight), those in the range 2.5-10 μm by a factor of 7.3 (from 2.9 to 21.1% by weight), reduced those in the range 1-2.5 μm by a factor of 1.7 (from 4.4 to 2.6% by weight), and those less than 1 μm by a factor of 1.3 (from 91.2 to 68.4% by weight) in the total particulate collected. Thus, the number of particles greater than 2.5 μm increased by a factor of 6.5 (4.4% to 29.0% by weight) and the number of particles less than 2.5 μm increased by a factor of 1.3 (95.6% to 71.0% by weight).

FIG. 4 shows that the use of a plasma chamber coupled to an exhaust flue can reduce the total particulate emission of the biomass boiler combustion by 45% from start to full load of the biomass boiler combustion. The total particulate emission when there is no plasma is 7.6 mg/m$^3$ compared to 4.2 mg/m$^3$ when the plasma is turned on (15 W). Thus, the introduction of plasma ionised air into the exhaust flue results in a significant reduction in the total emission of particulates from the exhaust flue.

The SEM images reveal that the incorporation of ionised air through the use of a plasma can reduce the amount of fine particulates produced during biomass combustion through agglomeration of fine particulates in the exhaust flue. This produces a greater proportion of larger particulates, as shown in FIG. 3 and FIG. 4. The particle size distribution is significantly shifted from the sub-micron range to larger sizes. These larger particulates are significantly easier to collect compared to finer particles using cyclones, electrostatic precipitators, filters or water scrubbers.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A combustion apparatus comprising:
a combustion chamber with an exhaust flue;
a plasma chamber comprising a plasma source for ionising gas, said plasma chamber having an ionised gas outlet that is coupled to the exhaust flue for mixing ionised gas with exhaust gas from the combustion chamber so as to allow mixing of the ionised gas with the exhaust gas from the combustion chamber in the exhaust flue; and
an air inlet which allows air to be drawn into the plasma chamber, wherein the gas that is ionised is said air,
wherein the combustion chamber is a stove, boiler, or heater.

2. The combustion apparatus of claim 1, further comprising a particulate collection means.

3. The combustion apparatus of claim 1, wherein the plasma source is selected from the group consisting of an AC glow discharge, a microwave plasma, gliding arc plasma, a radio frequency plasma, a DC corona torch, a DC corona discharge reactor, and a dielectric barrier discharge (DBD) reactor.

4. The combustion apparatus of claim 3, wherein the plasma source is the dielectric barrier discharge (DBD) reactor.

5. The combustion apparatus of claim 1, wherein the plasma source is a non-thermal plasma source.

6. The combustion apparatus of claim 1, wherein the plasma source generates a plasma having an energy insufficient to break covalent bonds in gasses.

7. The combustion apparatus of claim 1, wherein the plasma source does not generate ozone from air.

8. The combustion apparatus of claim 1, wherein the combustion chamber burns a fuel selected from the group consisting of coal, wood, and biofuel.

9. A method of making a combustion apparatus, the method comprising:
- providing a combustion chamber connected to an exhaust flue;
- providing a plasma chamber comprising a plasma source for ionising gas, said plasma having an ionised gas outlet;
- coupling the ionised gas outlet to the exhaust flue such that ionised gas from the plasma chamber can be mixed with exhaust gas from the combustion chamber in the exhaust flue; and
- providing an air inlet which allows air to be drawn into the plasma chamber, wherein the gas that is ionised is said air,
- wherein the combustion chamber is a stove, boiler, or heater.

* * * * *